United States Patent
Wang et al.

(10) Patent No.: US 8,164,971 B2
(45) Date of Patent: Apr. 24, 2012

(54) DUAL POWER RAIL WORD LINE DRIVER AND DUAL POWER RAIL WORD LINE DRIVER ARRAY

(75) Inventors: Chia-Wei Wang, Taichung County (TW); Joseph Patrick Geisler, Austin, TX (US); Paul William Hollis, Austin, TX (US); Matthew B Rutledge, Austin, TX (US)

(73) Assignee: Mediatek Inc., Hsin-Chu (TW)

( * ) Notice: Subject to any disclaimer, the term of this patent is extended or adjusted under 35 U.S.C. 154(b) by 264 days.

(21) Appl. No.: 12/719,075

(22) Filed: Mar. 8, 2010

(65) Prior Publication Data

US 2010/0302880 A1     Dec. 2, 2010

Related U.S. Application Data

(60) Provisional application No. 61/183,157, filed on Jun. 2, 2009.

(51) Int. Cl.
*G11C 8/00* (2006.01)
(52) U.S. Cl. .......... 365/230.06; 365/189.11; 365/189.08
(58) Field of Classification Search .............. 365/230.06, 365/189.11, 189.08, 230.08
See application file for complete search history.

(56) References Cited

U.S. PATENT DOCUMENTS

| | | | | |
|---|---|---|---|---|
| 6,490,222 | B2 * | 12/2002 | Choi et al. | 365/201 |
| 6,646,949 | B1 * | 11/2003 | Ellis et al. | 365/230.06 |
| 6,813,216 | B2 * | 11/2004 | Lee | 365/230.06 |

OTHER PUBLICATIONS

Chen, Y.H., et al.; "A 0.6V 45nm Adaptive Dual-Rail SRAM Compiler Circuit Design for Lower VDD_min VLSIs;" Symposium on VLSI Circuits Digest of Technical Papers; 2008; pp. 210-211.

* cited by examiner

*Primary Examiner* — Son Dinh
(74) *Attorney, Agent, or Firm* — Thomas|Kayden (57) ABSTRACT

A dual power rail word line driver for driving a word line of a memory array according to a predecode signal from a decoder powered by a first supply voltage is provided. A signal buffering unit is coupled between the word line and a node. A pull-down unit is coupled between the node and a ground. A pull-up unit is coupled between the node and a second supply voltage higher than or equal to the first supply voltage. The signal buffering unit provides a word line signal corresponding to the predecode signal to the memory array via the word line when the pull-down unit is turned on by the predecode signal and a first pulse signal and the pull-up unit is turned off by a second pulse signal. There is no level shifter on a critical timing path of the dual power rail word line driver.

25 Claims, 9 Drawing Sheets

DUAL POWER RAIL WORD LINE DRIVER AND DUAL POWER RAIL WORD LINE DRIVER ARRAY

CROSS REFERENCE TO RELATED APPLICATIONS

This application claims the benefit of U.S. Provisional Application No. 61/183,157, filed on Jun. 2, 2009, the entirety of which is incorporated by reference herein.

BACKGROUND OF THE INVENTION

1. Field of the Invention

The invention relates to a word line driver for a memory, and more particularly to a dual power rail word line driver.

2. Description of the Related Art

Since process technologies have been scaled down, such as the deep sub-micron process, the layout area of a system on chip (SOC) has greatly been decreased. However, memory device reliability (e.g. static random access memory (SRAM)) in the greatly decreased sized SOC worsens due to low supply voltages, threshold voltage mismatch caused by process variations and so on. For example, a threshold voltage mismatch of a memory device is about 35 mV/sigma for 65 nm process. Moreover, such threshold voltage mismatch of a memory device is hard to estimate or simulate by a SPICE corner model, such as an SS (slow PMOS, slow NMOS), TT (typical PMOS, typical NMOS), FF (fast PMOS, fast NMOS), SF, or FS model.

In general, a 10 Mbit memory or greater, is common in an SOC. If a memory device of the SOC is operated with low supply voltage, read/write fail occurs due to threshold voltage mismatch among the memory cells. Furthermore, defect density of read/write fail is increased when supply voltage is decreased.

Figure 1:
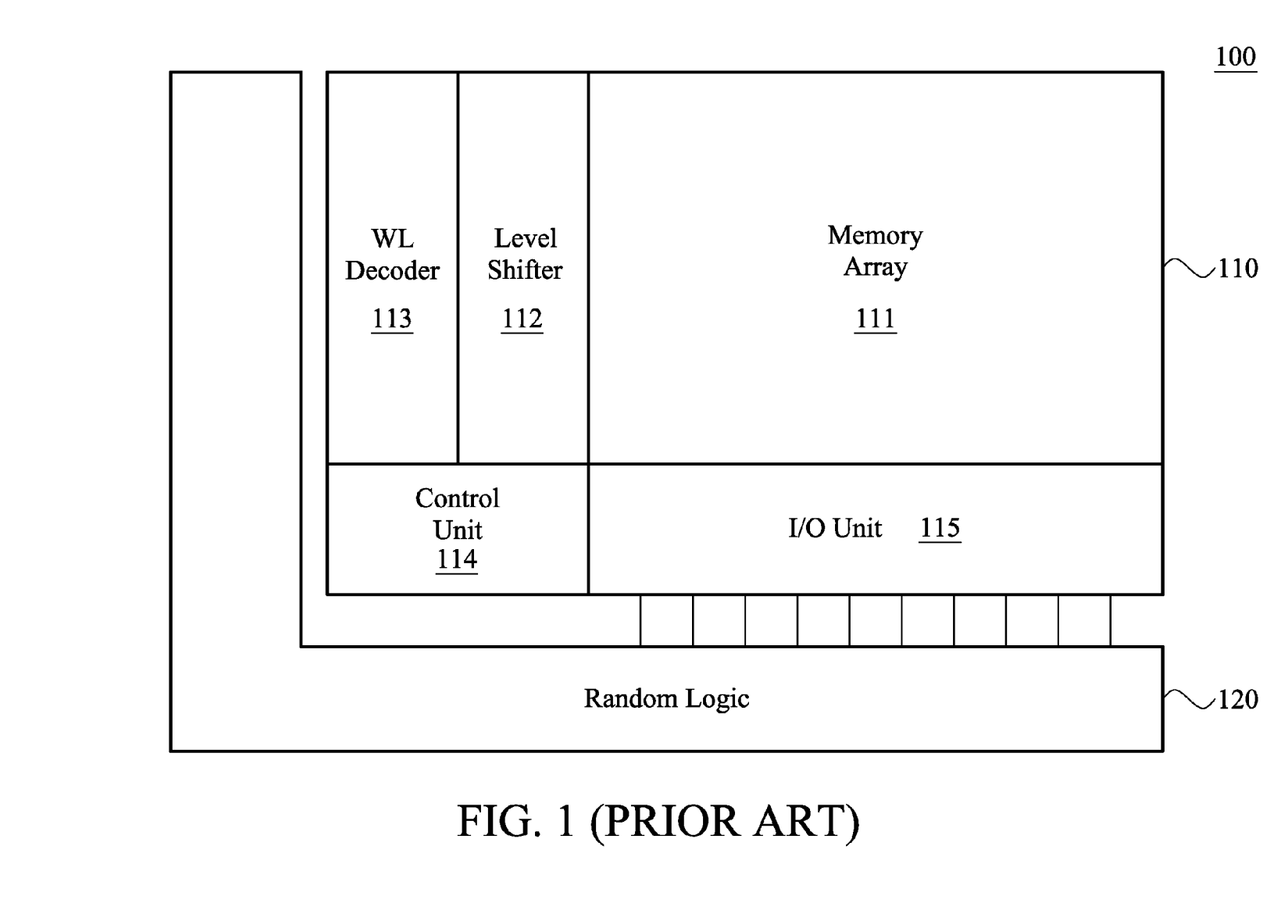
FIG. 1 shows a schematic diagram of an SRAM.

FIG. 1 shows a schematic diagram of an SRAM 110, wherein the SRAM 110 is implemented in an integrated circuit 100. The integrated circuit 100 further comprises a random logic 120 which is powered by a supply voltage VDD. The SRAM 110 comprises a memory array 111 with a plurality of memory cells, a level shifter 112, a word line (WL) decoder 113 for decoding the address signals to obtain the predecode signals, a control unit 114 for controlling the read/write operations, and an input/output (I/O) unit 115 for receiving and transmitting data between the SRAM 110 and the random logic 120. Besides, there could be address, clock, read/write control signals running between the control unit 114 and the random logic 120. In order to avoid read/write failure for the SRAM 110, the memory array 111 is powered by a supply voltage CVDD higher than the supply voltage VDD. The word line decoder 113, the control unit 114 and the I/O unit 115 are powered by the supply voltage VDD so as to save power. Therefore, the level shifter 112 is disposed between the word line decoder 113 and the memory array 111, which is used to change the voltage levels of signals generated by the word line decoder 113 from the supply voltage VDD level to the supply voltage CVDD level, so as to drive the memory array 111.

Figure 2:
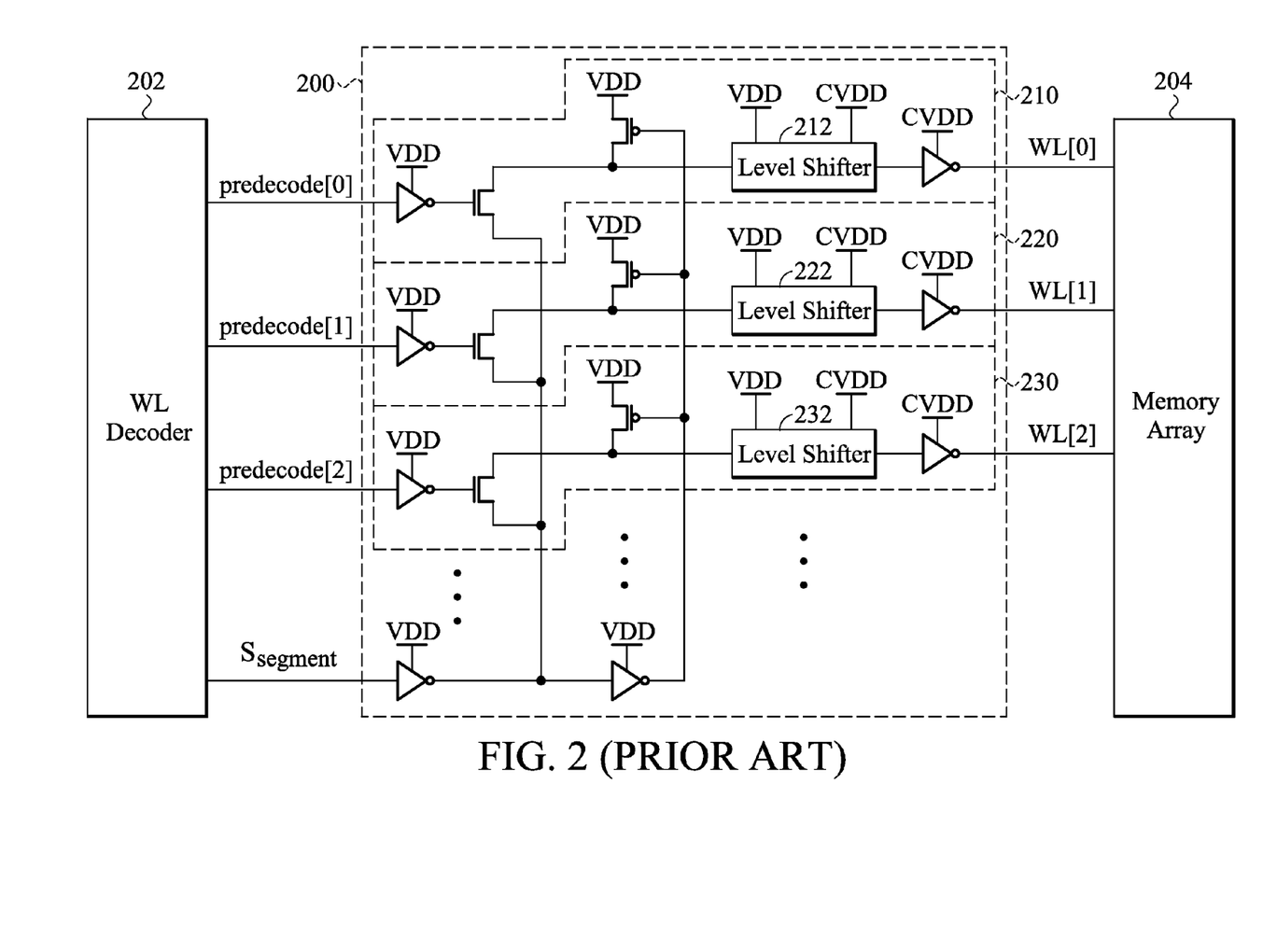
FIG. 2 shows a word line driver array with a plurality of dual power rail drivers.

FIG. 2 shows a word line driver array 200 with a plurality of dual power rail drivers, wherein the word line driver array 200 is coupled between a word line decoder 202 powered by the supply voltage VDD and a memory array 204 powered by the supply voltage CVDD. The word line decoder 202 provides a segment signal $S_{segment}$ indicating that one section of the SRAM corresponding to the address signals has been selected. The word line decoder 202 further provides a plurality of predecode signals (ex. predecode[0], predecode[1], predecode[2] etc.) to the word line driver array 200 according to the address signals. Each dual power rail driver generates a word line signal according to the corresponding predecode signal and the segment signal $S_{segment}$. For example, when the segment signal $S_{segment}$ is asserted, the driver 210 generates a word line signal WL[0] according to the predecode signal predecode[0], the driver 220 generates a word line signal WL[1] according to the predecode signal predecode[1], the driver 230 generates a word line signal WL[2] according to the predecode signal predecode[2] and so on. In the word line driver array 200, each word line driver has a level shifter, such as a level shifter 212 of the driver 210, a level shifter 222 of the driver 220 or a level shifter 232 of the driver 230, wherein each level shifter is disposed in data transmission path. Therefore, layout area and extra gate-delay in the critical timing path are increased, thus slowing access of the memory array.

Figure 3:
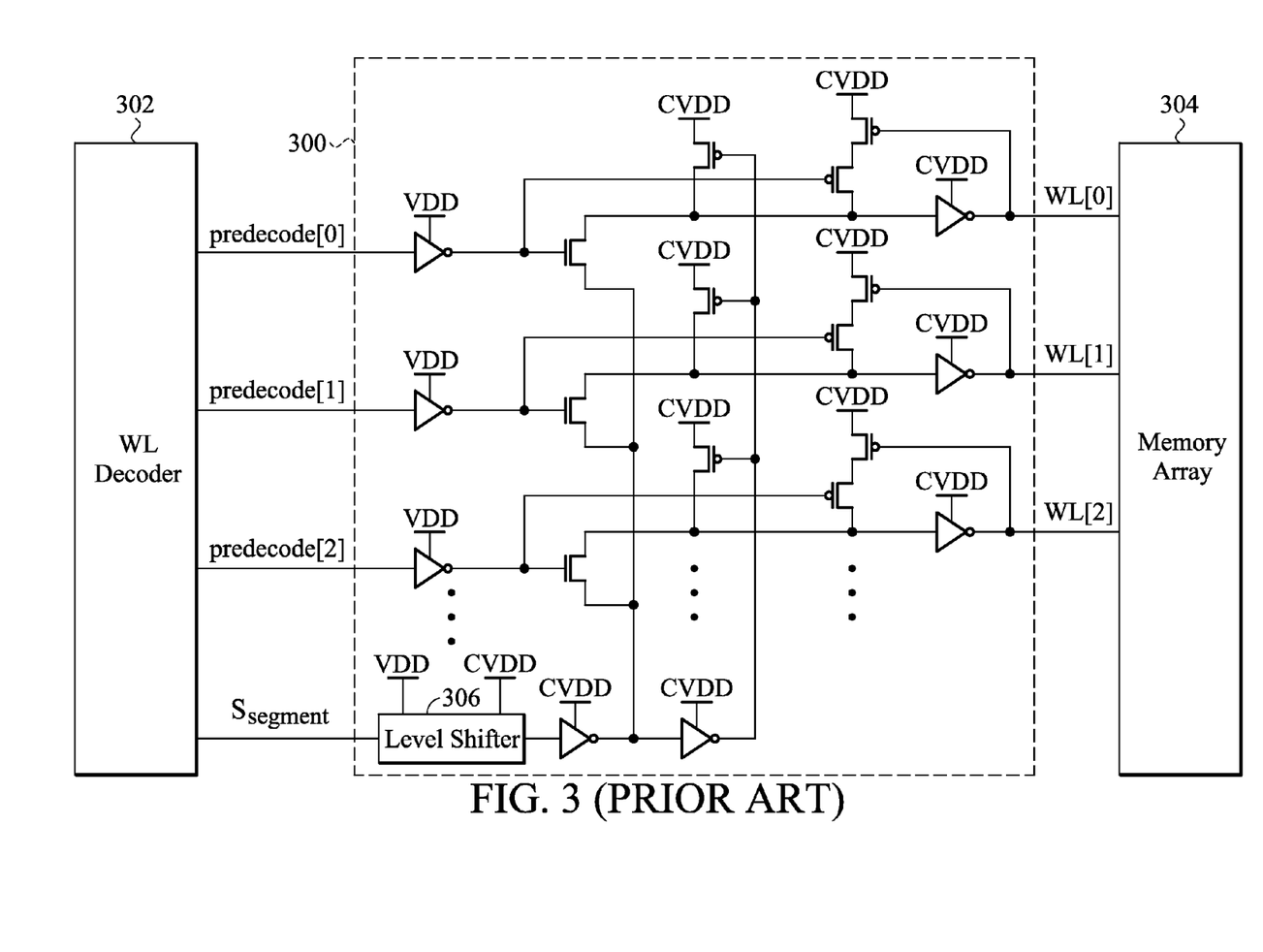
FIG. 3 shows another word line driver array with a plurality of dual power rail drivers.

FIG. 3 shows another word line driver array 300 with a plurality of dual power rail drivers, wherein the word line driver array 300 is coupled between a word line decoder 302 powered by the supply voltage VDD and a memory array 304 powered by the supply voltage CVDD. Compared with the word line driver array 200 of FIG. 2, no level shifter exists in data transmission path for each word line driver in the word line driver array 300, thereby the layout area of the word line driver array 300 is smaller than that of the word line driver array 200 of FIG. 2. However, a level shifter 306 disposed in the segment signal transmission path is used to change the voltage levels of a segment signal $S_{segment}$ generated by the word line decoder 302 from the supply voltage VDD level to the supply voltage CVDD level. Therefore, an extra gate-delay in the critical timing path is increased, thus slowing access of the memory array.

BRIEF SUMMARY OF THE INVENTION

A dual power rail word line driver and dual power rail word line driver array are provided. An exemplary embodiment of a dual power rail word line driver for driving a word line of a memory array according to a predecode signal from a decoder powered by a first supply voltage is provided. The dual power rail word line driver comprises a signal buffering unit coupled between the word line and a node, a pull-down unit coupled between the node and a ground and a first pull-up unit coupled between the node and a second supply voltage higher than or equal to the first supply voltage. The pull-down unit is controlled by the predecode signal and a first pulse signal. The first pull-up unit is controlled by a second pulse signal. The signal buffering unit provides a word line signal corresponding to the predecode signal to the memory array via the word line when the first pull-up unit is turned off by the second pulse signal and the pull-down unit is turned on by the predecode signal and the first pulse signal. There is no level shifter on a critical timing path of the dual power rail word line driver.

Moreover, an exemplary embodiment of a word line driver array for a memory array is provided. The word line driver array comprises a first common transistor and a plurality of dual power rail word line drivers, each driving a word line of the memory array according to a predecode signal which from a decoder powered by a first supply voltage. Each of the plurality of dual power rail word line drivers comprises a signal buffering unit coupled between the word line and a node, a first transistor coupled between the second terminal of the first common transistor and the node, and a second transistor coupled between the node and a second supply voltage higher than or equal to the first supply voltage. The first transistor is controlled by the predecode signal. The second transistor has a gate for receiving a second pulse signal. The signal buffering unit provides a word line signal corresponding to the predecode signal to the memory array via the word line when the second transistor is turned off and the first common transistor is turned on. There is no level shifter on a critical timing path of the dual power rail word line driver.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. The description is made for the purpose of illustrating the general principles of the invention and should not be taken in a limiting sense. The scope of the invention is best determined by reference to the appended claims.

Figure 4:
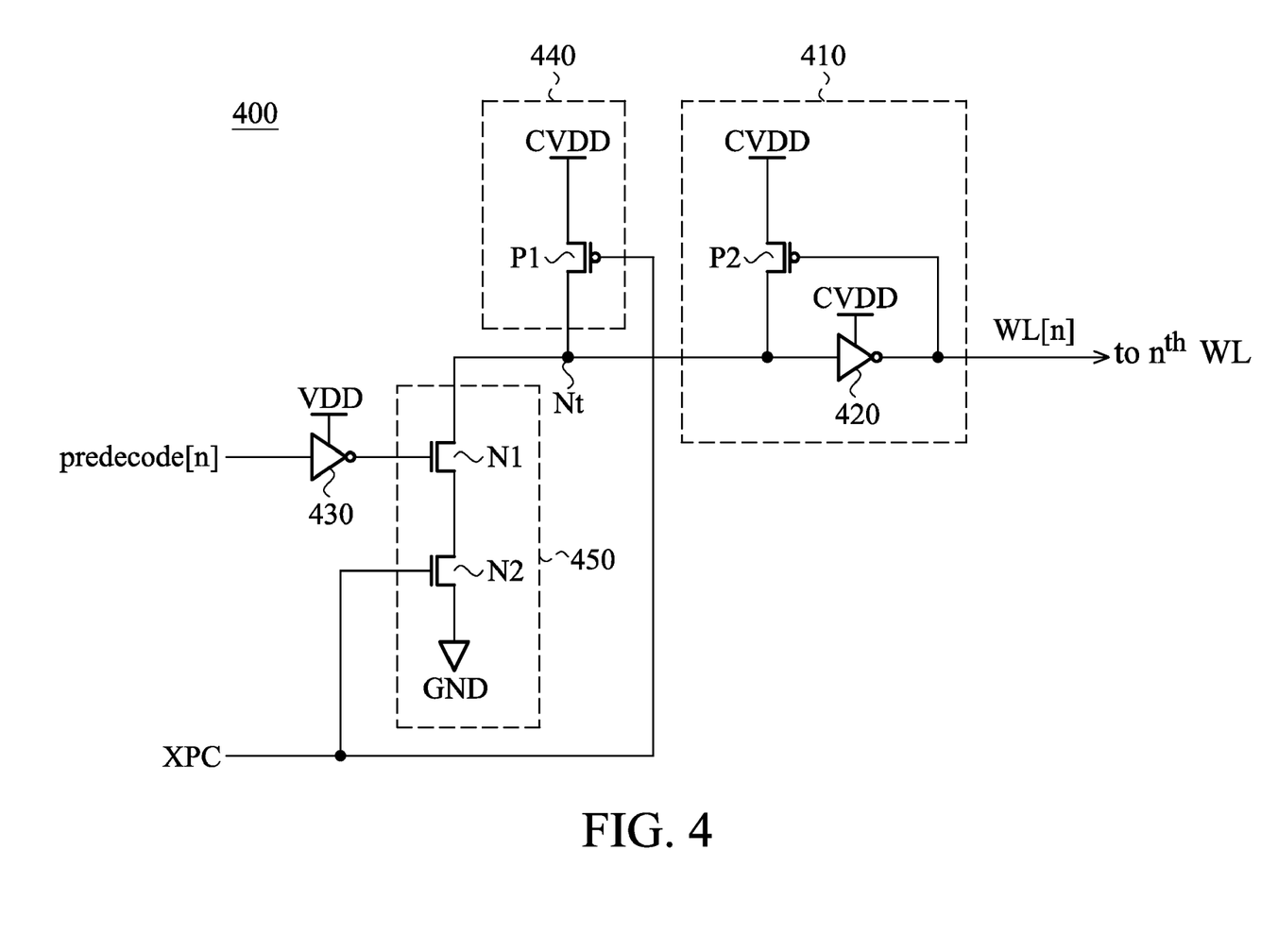
FIG. 4 shows a schematic diagram illustrating a dual power rail word line driver according to an embodiment of the invention.

FIG. 4 shows a schematic diagram illustrating a dual power rail word line driver 400 according to an embodiment of the invention. The word line driver 400 receives a predecode signal predecode[n] from a word line decoder (e.g. the word line decoder 113 of FIG. 1) and provides a word line signal WL[n] to drive the $n^{th}$ word line of a memory array (e.g. the memory array 111 of FIG. 1), wherein the word line driver 400 comprises a signal buffering unit 410, an inverter 430, a pull-up unit 440 and a pull-down unit 450. The predecode signal could be an output signal from the decoder or an address signal. The signal buffering unit 410 is coupled between the $n^{th}$ word line and a node Nt, which comprises a PMOS transistor P2 and an inverter 420. The signal buffering unit 410 could be a latch, half latch, buffer, or any component capable of buffering or driving signal. The PMOS transistor P2 is coupled between a supply voltage CVDD and the node Nt, and has a gate coupled to the $n^{th}$ word line. The inverter 420 is coupled between the $n^{th}$ word line and the node Nt, which is powered by the supply voltage CVDD. In the embodiment, the signal buffering unit 410 is used as an example for description, and does not limit the invention. The pull-up unit 440 comprises a PMOS transistor P1 coupled between the supply voltage CVDD and the node Nt, wherein the PMOS transistor P1 has a gate for receiving a signal XPC powered by a supply voltage VDD lower than the supply voltage CVDD, wherein the signal XPC is a global pulse signal for a word line decoding operation. The supply voltage VDD may, but not limited to, range between 0.5 and 1.6V, while the supply voltage CVDD may, but not limited to, range between 0.9 and 1.6V. The pull-down unit 450 is coupled between the node Nt and a ground GND, which comprises two NMOS transistor N1 and N2 connected in series. The NMOS transistor N1 is coupled between the node Nt and the NMOS transistor N2, and has a gate coupled to the inverter 430. The inverter 430 receives the predecode signal predecode[n] and controls the NMOS transistor N1 to turn on or off according to a signal opposite to the predecode signal predecode[n], wherein the inverter 430 is powered by the supply voltage VDD. The NMOS transistor N2 is coupled between the NMOS transistor N1 and the ground GND, and has a gate for receiving the pulse signal XPC. In this embodiment, there is no level shifter on a critical timing path of the dual power rail word line driver 400. The critical timing path of the dual power rail word line driver 400 could be from the signal XPC rising to word line signal WL[n] rising. As to a memory array, the critical timing path could be sum of clock signal rising-to-word line signal WL[n] rising, word line signal WL[n] rising-to-sense amplifier sensing data, and data output. Since there is no level shifter on the critical timing path of the exemplary dual power rail word line driver 400, gate-delay on the timing path of the memory array could be decreased and access of the memory array could be speeded up.

Figure 5:
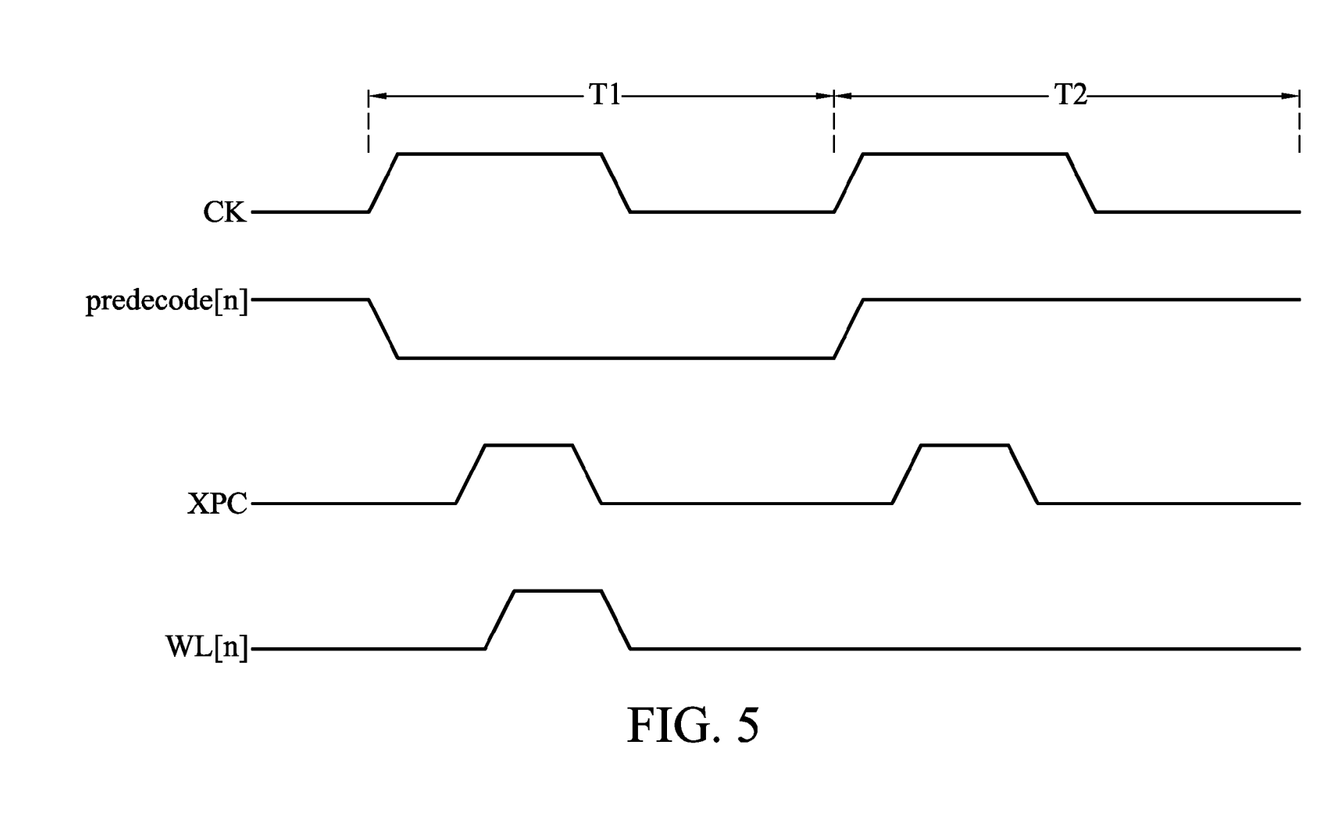
FIG. 5 shows a waveform diagram illustrating the signals of the dual power rail word line driver of FIG. 4 according to an embodiment of the invention.

FIG. 5 shows a waveform diagram illustrating the signals of the dual power rail word line driver 400 of FIG. 4 according to an embodiment of the invention. In FIG. 5, a signal CK represents a clock signal from a random logic (e.g. the random logic 120 of FIG. 1). When the signal CK is asserted, the pulse signal XPC is changed to a high logic level (e.g. the supply voltage VDD level). The SRAM is designed as a self-timed and dynamic circuit, and the pulse signal XPC is changed to a low logic level (e.g. the ground GND level) when the bit line data of the SRAM has been determined. Therefore, the pulse signal XPC has a narrow pulse width (ex. pulse width <1 ns).

Referring to FIG. 4 and FIG. 5 together, the PMOS transistor P1 is turned on and the NMOS transistor N2 is turned off when the pulse signal XPC is at a low logic level, thus a voltage at the node Nt is pulled up to the supply voltage CVDD level via the PMOS transistor P1 of the pull-up unit 440 and then the word line signal WL [n] is buffered at a low logic level through the signal buffering unit 410. In addition, when the pulse signal XPC is at a high logic level, the PMOS transistor P1 is turned off and the NMOS transistor N2 is turned on, thus the voltage at the node Nt is determined according to the predecode signal predecode[n]. For example, at period T1, the predecode signal predecode[n] is at a low logic level (ex. the ground GND level), thus the NMOS transistor N1 is turned on. Therefore, the voltage at the node Nt is pulled down to the ground GND by the pull-down unit 450 when the pulse signal XPC is asserted, and then the inverter 420 provides the word line signal WL [n] with the supply voltage CVDD level to drive the $n^{th}$ word line of the memory array until the pulse signal XPC is changed to a low logic level. Next, at period T2, the predecode signal predecode[n] is at a high logic level (ex. the supply voltage VDD level), thus the NMOS transistor N1 is turned off. Therefore, the voltage at the node Nt is pulled up to the supply voltage CVDD level by the pull-up unit 440 when the PMOS transistor P1 is turned on by the pulse signal XPC, and the voltage at the node Nt is also buffered at the supply voltage CVDD level through the signal buffering unit 410 when the pulse signal XPC is at a high logic level, thus the word line signal WL [n] is held at a low logic level during period T2.

Figure 6:
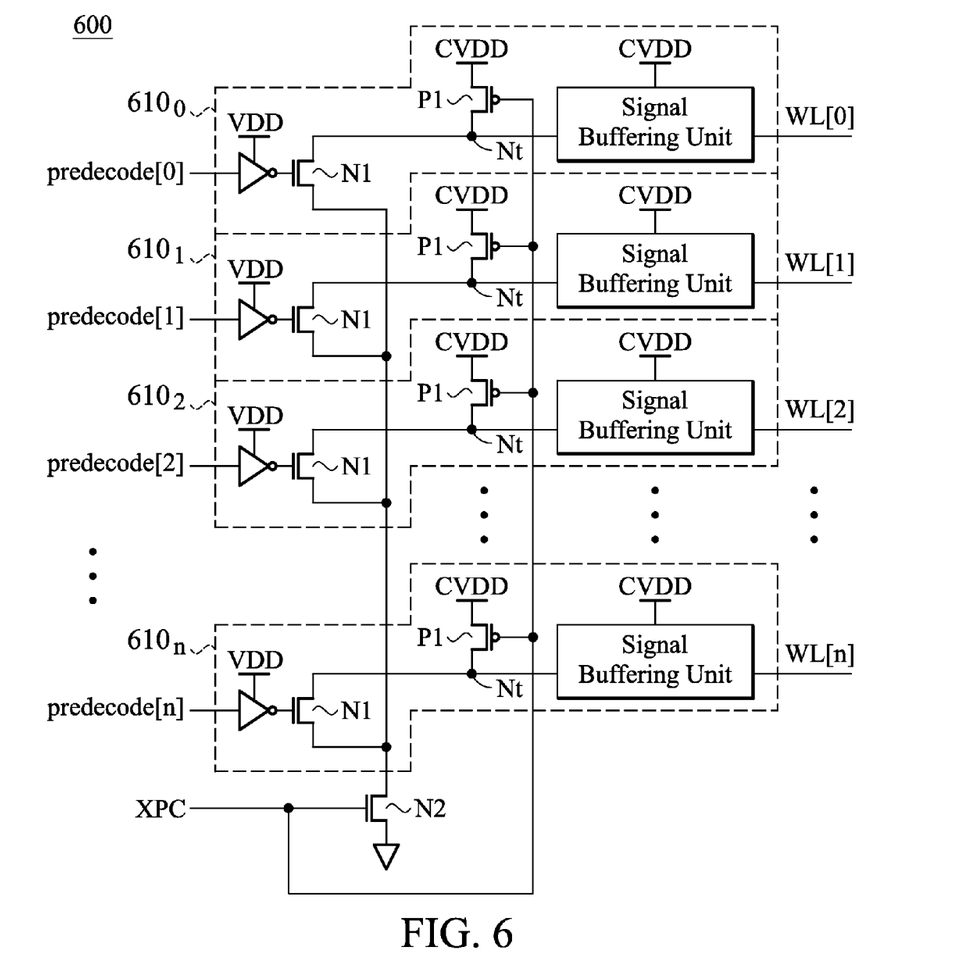
FIG. 6 shows a word line driver array according to an embodiment of the invention.

Referring back to FIG. 4, if a difference between the supply voltage VDD and the supply voltage CVDD is larger than a specific voltage (ex. a threshold voltage of the PMOS transistor P1), it is difficult for the pulse signal XPC with the supply voltage VDD level to completely turn off the PMOS transistor P1, thus a leakage current is generated from the supply voltage CVDD to the ground GND via the PMOS transistor P1 and the NMOS transistors N1 and N2 when the word line WL[n] is active. Therefore, using a high threshold voltage (HVT) transistor or a long channel transistor as the PMOS transistor P1 may minimize the leakage current. Here the high threshold voltage may include, but not limited to, a threshold voltage 25-350 mV higher than a typical threshold voltage. The long channel transistor may include, but not limited to, a transistor with a channel length 3-70 nm longer than a minimum channel length in the process by which the transistor is fabricated. For example, the minimum channel length in 65 nm process may be 65 nm, then the long channel transistor fabricated by 65 nm process may have a channel length 3-70 nm longer than 65 nm. Furthermore, the NMOS transistor N2 of the dual power rail word line driver 400 may be shared with other dual power rail word line drivers in order to decrease layout area, as shown in FIG. 6. FIG. 6 shows a word line driver array 600 according to an embodiment of the invention. The word line driver array 600 comprises a plurality of dual power rail word line drivers $610_0$-$610_n$ and a common NMOS transistor N2, wherein the dual power rail word line drivers $610_0$-$610_n$ share the same NMOS transistor N2. In another embodiment, the amount of the dual power rail word line drivers that share the same NMOS transistor N2 may be determined according to various requests for layout area and access speed. For example, two dual power rail word line drivers (e.g. $610_0$ and $610_1$) may share the same NMOS transistor N2, or four power rail word line drivers (e.g. $610_0$, $610_1$, $610_2$ and $610_3$) may share the same NMOS transistor N2. When the amount of the dual power rail word line drivers that share the same NMOS transistor N2 is increased, the layout area is decreased and the access speed is slowed down.

Figure 7:
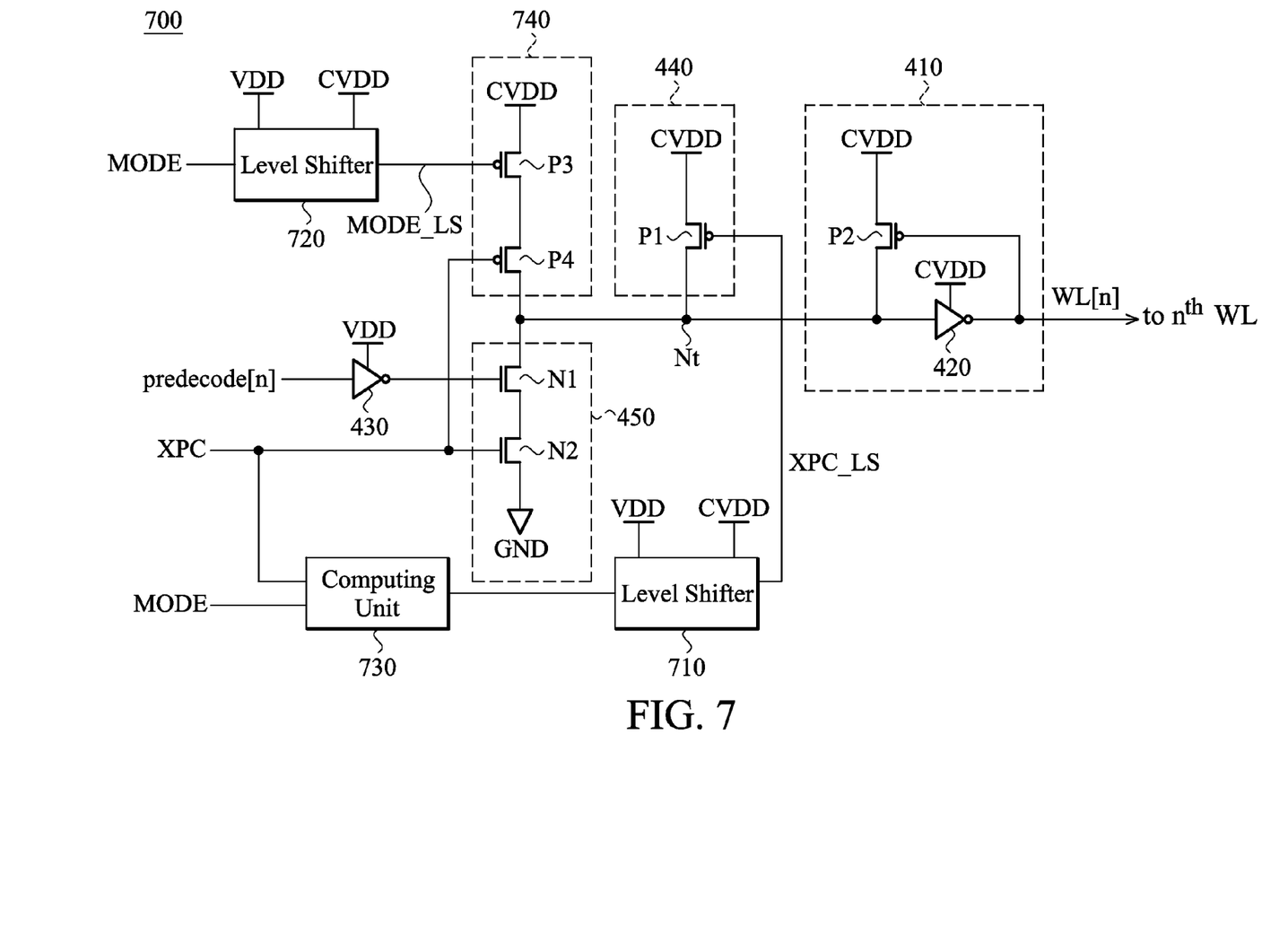
FIG. 7 shows a schematic diagram illustrating a dual power rail word line driver according to another embodiment of the invention.

In some embodiments, the dual power rail word line driver may further include a level shifter selectively present on the critical timing path of the dual power rail word line driver according to a mode select signal MODE. The level shifter could be not present on the critical timing path when a voltage difference $\Delta V$ between the supply voltage VDD and the supply voltage CVDD is smaller than or equal to a specific voltage Vs. The level shifter could be present on the critical timing path when the voltage difference $\Delta V$ is larger than the specific voltage Vs. Therefore, there could be no level shifter present on the critical timing path of the dual power rail word line driver when a voltage difference $\Delta V$ between the supply voltage VDD and the supply voltage CVDD is smaller than or equal to a specific voltage Vs, thus gate-delay is decreased, and access of the memory array is speeded up. FIG. 7 shows a schematic diagram illustrating a dual power rail word line driver 700 according to another embodiment of the invention. Compared with the dual power rail word line driver 400 of FIG. 4, the dual power rail word line driver 700 further comprises two level shifters 710 and 720, a computing unit 730 and a pull-up unit 740 coupled between the supply voltage CVDD and the node Nt. The supply voltage VDD may, but not limited to, range between 0.5 and 1.6V, while the supply voltage CVDD may, but not limited to, range between 0.9 and 1.6V. The pull-up unit 740 comprises two PMOS transistors P3 and P4 connected in series, the PMOS transistor P3 is coupled between the supply voltage CVDD and the PMOS transistor P4. The PMOS transistor P3 has a gate coupled to the level shifter 720 for receiving a signal MODE_LS, wherein the level shifter 720 receives a mode select signal MODE powered by the supply voltage VDD to provide the signal MODE_LS which is powered by the supply voltage CVDD. The mode select signal MODE is used to indicate that whether a voltage difference $\Delta V$ between the supply voltage VDD and the supply voltage CVDD is larger than a specific voltage Vs. For example, the mode select signal MODE is present when the voltage difference $\Delta V$ is larger than the specific voltage Vs, and the mode select signal MODE is absent when the voltage difference $\Delta V$ is smaller than or equal to the specific voltage Vs. In one embodiment, the specific voltage Vs is a voltage not larger than a threshold voltage of the PMOS transistor P1. The PMOS transistor P4 is coupled between the PMOS transistor P3 and the node Nt, and has a gate for receiving the pulse signal XPC. In FIG. 7, the PMOS transistor P1 is controlled by a signal XPC_LS from the level shifter 710 not the pulse signal XPC. The level shifter 710 receives an output signal from the computing unit 730 to provide the signal XPC_LS which is powered by the supply voltage CVDD, wherein the computing unit 730 generates the output signal according to the pulse signal XPC and the mode select signal MODE. When the mode select signal MODE is absent, the level shifter 710 provides the signal XPC_LS with the supply voltage CVDD level to turn off the PMOS transistor P1 according to the output signal from the computing unit 730, thereby the PMOS transistor P1 is turned off more completely and less leakage current is generated when the word line WL[n] is active. Furthermore, when the voltage difference $\Delta V$ between the supply voltage VDD and the supply voltage CVDD is smaller than or equal to the specific voltage Vs, there is no timing impact on the dual power rail word line driver 700 since the critical timing path is separated. In some embodiments, the level shifter 710 and the level shifter 720 are the same level shifter. Thus the mode select signal MODE and the output signal from the computing unit 730 could be shifted by the same level shifter.

Figure 8:
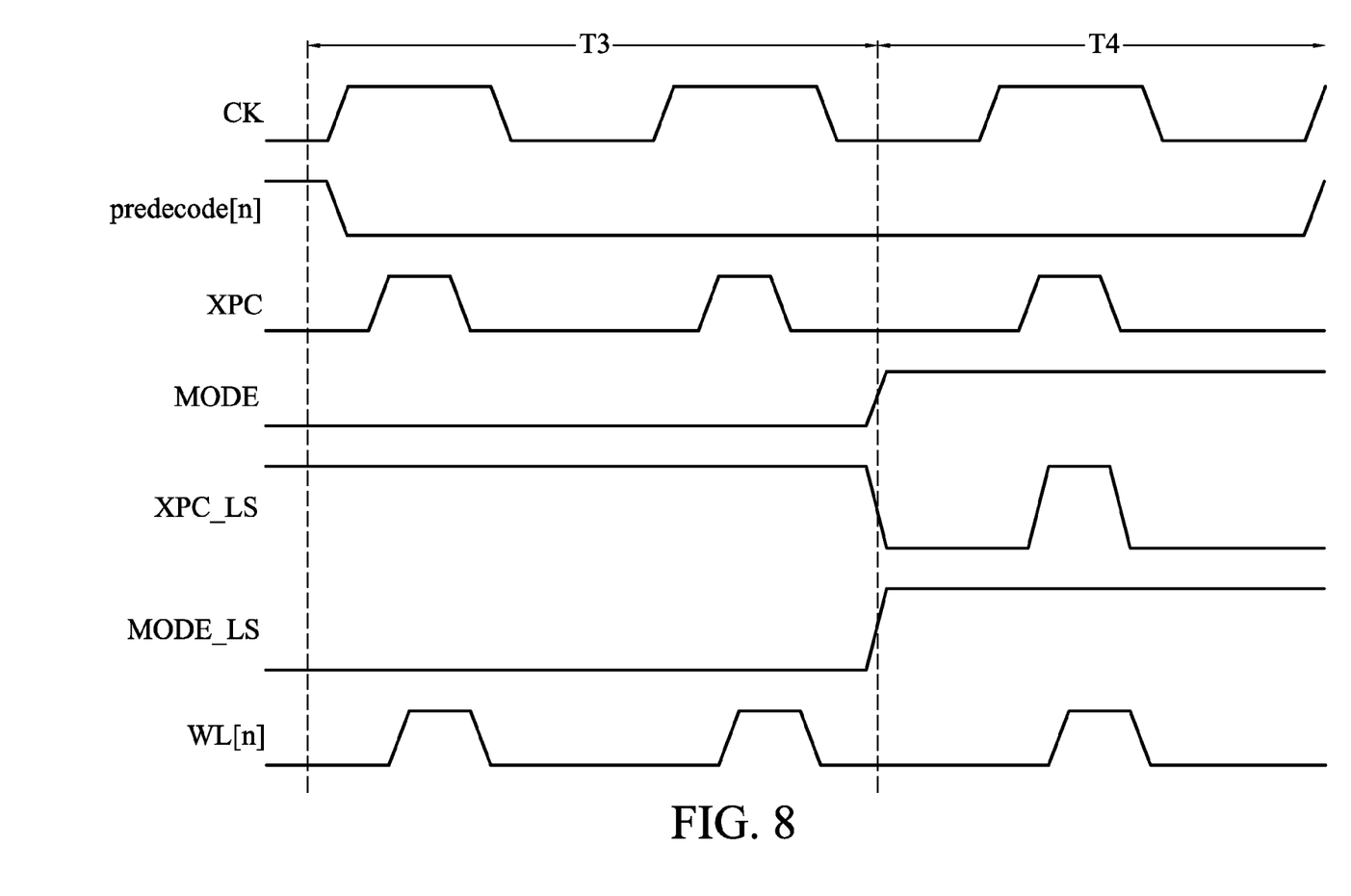
FIG. 8 shows a waveform diagram illustrating the signals of the dual power rail word line driver of FIG. 7 according to an embodiment of the invention.

FIG. 8 shows a waveform diagram illustrating the signals of the dual power rail word line driver 700 of FIG. 7 according to an embodiment of the invention. Referring to FIG. 7 and FIG. 8 together, the mode select signal MODE is absent at period T3 (ex. $\Delta V \leq Vs$), thereby the PMOS transistor P1 is turned off by the signal XPC_LS. In this embodiment, during period T3 (ex. $\Delta V \leq Vs$), no level shifter is present on the critical timing path of the dual power rail word line driver 700, thus gate-delay is decreased, and access of the memory array is speeded up. The NMOS transistor N2 is turned off and the PMOS transistor P4 is turned on when the pulse signal XPC is at a low logic level, thus a voltage at the node Nt is pulled up to the supply voltage CVDD level via the two PMOS transistors P3 and P4 of the pull-up unit 740 and then the word line signal WL [n] is buffered at a low logic level through the signal buffering unit 410. In addition, when the pulse signal XPC is at a high logic level, the PMOS transistor P4 is turned off and the NMOS transistor N2 is turned on, thus the voltage at the node Nt is determined according to the predecode signal predecode[n]. For example, at period T3, the predecode signal predecode[n] is at a low logic level (ex. the ground GND level), thus the NMOS transistor N1 is turned on. Therefore, the voltage at the node Nt is pulled down to the ground GND via the two NMOS transistors N1 and N2 of the pull-down unit 450 when the pulse signal XPC is asserted, and then the inverter 420 provides the word line signal WL [n] with the supply voltage CVDD level to drive the $n^{th}$ word line of the memory array until the pulse signal XPC is changed to a low logic level. Next, at period T4, the mode select signal MODE is present (ex. ΔV>Vs), thereby the PMOS transistor P3 is turned off and the signal XPC_LS is generated according to the pulse signal XPC. When the pulse signal XPC is at a low logic level, the PMOS transistor P1 is turned on by the signal XPC_LS, thus the voltage at the node Nt is pulled up to the supply voltage CVDD level via the PMOS transistor P1 of the pull-up unit 440 and then the word line signal WL [n] is buffered at a low logic level through the signal buffering unit 410. In addition, when the pulse signal XPC is at a high logic level, the NMOS transistor N2 is turned on and the PMOS transistor P1 is turned off by the signal XPC_LS, thus the voltage at the node Nt is determined according to the predecode signal predecode[n]. For example, the predecode signal predecode[n] is at a low logic level, thus the NMOS transistor N1 is turned on. Therefore, the voltage at the node Nt is pulled down to a low logic level via the two NMOS transistors N1 and N2 of the pull-down unit 450 when the pulse signal XPC and the signal XPC_LS are asserted, and then the inverter 420 provides the word line signal WL [n] with the supply voltage CVDD level to drive the $n^{th}$ word line of the memory array until the pulse signal XPC is changed to a low logic level.

Figure 9:
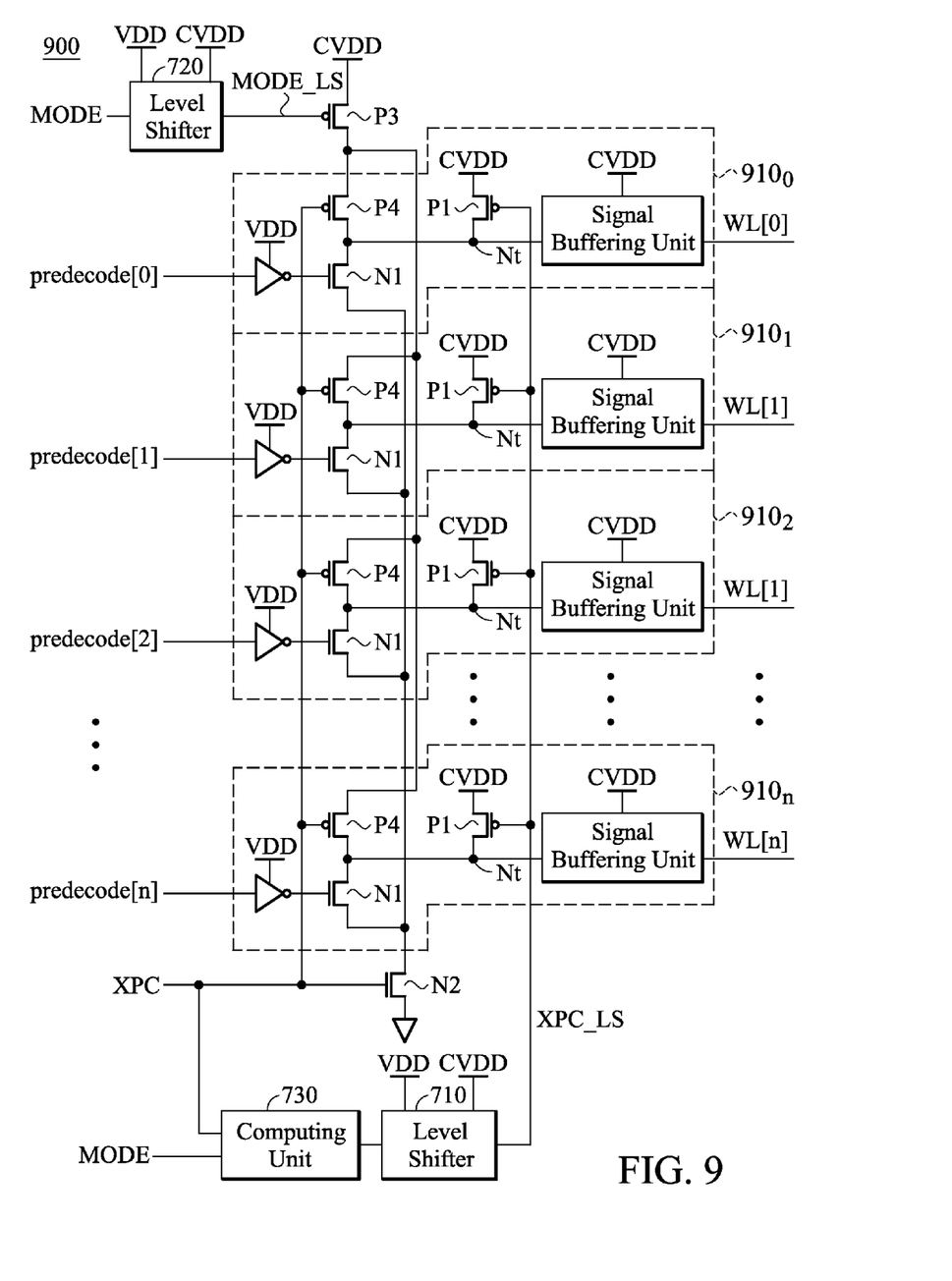
FIG. 9 shows a word line driver array 900 according to an embodiment of the invention.

Referring to FIG. 7, the level shifter 710, the NMOS transistor N2 and the PMOS transistor P3 of the dual power rail word line driver 700 may be shared with other dual power rail word line drivers in order to decrease layout area, as shown in FIG. 9. FIG. 9 shows a word line driver array 900 according to an embodiment of the invention. The word line driver array 900 comprises a plurality of dual power rail word line drivers $910_0$-$910_n$, a common NMOS transistor N2, a common PMOS P3 and a level shifter 710. As described above, the amount of the dual power rail word line drivers that share the same NMOS transistor N2 may be determined according to various requests for layout area and access speed. Similarly, the amount of the dual power rail word line drivers that share the same PMOS transistor P3 may be determined according to various requests for layout area and access speed. For example, two dual power rail word line drivers (e.g. $910_0$ and $910_1$) may share the same PMOS transistor P3, or four power rail word line drivers (e.g. $910_0$, $910_1$, $910_2$ and $910_3$) may share the same PMOS transistor P3. When the amount of the dual power rail word line drivers that share the same PMOS transistor P3 is increased, the layout area is decreased and the access speed is slowed down.

It is to be noted that, the type of the transistors in the embodiments of FIGS. 4, 6-7 and 9 are used as an example for description, and does not limit the invention. For example, the transistor P1 of FIG. 4 may be an NMOS transistor, which is controlled by a signal complementary to the pulse signal XPC. Therefore, by modifying the signals to control the switch of the transistors, the type of the transistors may be selected flexibly.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:
1. A dual power rail word line driver for driving a word line of a memory array according to a predecode signal from a decoder powered by a first supply voltage, comprising:
 a signal buffering unit coupled between the word line and a node;
 a pull-down unit coupled between the node and a ground, wherein the pull-down unit is controlled by the predecode signal and a first pulse signal; and
 a first pull-up unit coupled between the node and a second supply voltage higher than or equal to the first supply voltage, wherein the first pull-up unit is controlled by a second pulse signal;
 wherein the signal buffering unit provides a word line signal corresponding to the predecode signal to the memory array via the word line when the first pull-up unit is turned off by the second pulse signal and the pull-down unit is turned on by the predecode signal and the first pulse signal, and there is no level shifter on a critical timing path of the dual power rail word line driver.

2. The dual power rail word line driver as claimed in claim 1, wherein the second pulse signal is identical to the first pulse signal, and the first and second pulse signals are powered by the first supply voltage.

3. The dual power rail word line driver as claimed in claim 1, wherein the pull-down unit comprises:
 a first transistor coupled to the node, wherein the first transistor is controlled by the predecode signal; and
 a second transistor coupled between the first transistor and the ground, having a gate for receiving the first pulse signal; and
the pull-up unit comprises:
 a third transistor coupled between the node and the second supply voltage, having a gate for receiving the second pulse signal,
 wherein the signal buffering unit provides the word line signal corresponding to the predecode signal to the memory array via the word line when the third transistor is turned off and the second transistor is turned on.

4. The dual power rail word line driver as claimed in claim 3, wherein the third transistor is a high threshold voltage transistor or a long channel transistor.

5. The dual power rail word line driver as claimed in claim 3, further comprising:
 a first inverter coupled between a gate of the first transistor and the decoder, controlling the first transistor to turn on or off according to the predecode signal, wherein the first inverter is powered by the first supply voltage.

6. The dual power rail word line driver as claimed in claim 3, wherein a difference between the first supply voltage and the second supply voltage is not larger than a threshold voltage of the third transistor.

7. The dual power rail word line driver as claimed in claim 3, wherein the signal buffering unit comprises:
 a fourth transistor coupled between the second supply voltage and the node, having a gate coupled to the word line; and
 a second inverter coupled between the node and the word line, wherein the second inverter is powered by the second supply voltage.

8. The dual power rail word line driver as claimed in claim 1, further comprising a level shifter selectively present on the critical timing path of the dual power rail word line driver according to a mode select signal.

9. The dual power rail word line driver as claimed in claim 8, wherein the level shifter generates the second pulse signal according to the first pulse signal and the mode select signal.

10. The dual power rail word line driver as claimed in claim 8, wherein the level shifter is not present on the critical timing path when a voltage difference between the first supply voltage and the second supply voltage is smaller than or equal to a specific voltage, and the level shifter is present on the critical timing path when the voltage difference is larger than the specific voltage.

11. The dual power rail word line driver as claimed in claim 10, wherein the specific voltage is not larger than a threshold voltage of a transistor of the first pull-up unit.

12. The dual power rail word line driver as claimed in claim 1, further comprising:
   a second pull-up unit coupled between the second supply voltage and the node, wherein the second pull-up unit is controlled by a mode select signal and the first pulse signal; and
   a level shifter, generating the second pulse signal according to the first pulse signal and the mode select signal;
   wherein the first pulse signal and the mode select signal are powered by the first supply voltage, and the second pulse signal is powered by the second supply voltage.

13. The dual power rail word line driver as claimed in claim 12, wherein the second pull-up unit comprises:
   a fifth transistor coupled to the second supply voltage, wherein the fifth transistor is controlled by the mode select signal; and
   a sixth transistor coupled between the fifth transistor and the node, having a gate for receiving the first pulse signal.

14. The dual power rail word line driver as claimed in claim 13, wherein the fifth transistor is turned on by the mode select signal when a voltage difference between the first supply voltage and the second supply voltage is smaller than or equal to a specific voltage, and the fifth transistor is turned off by the mode select signal when the voltage difference is larger than the specific voltage, wherein the specific voltage is not larger than a threshold voltage of a transistor of the first pull-up unit.

15. The dual power rail word line driver as claimed in claim 12, wherein the level shifter generates the second pulse signal to turn off the first pull-up unit according to the mode select signal when the voltage difference is smaller than or equal to the specific voltage, and the level shifter generates the second pulse signal to turn on or off the first pull-up unit according to the first pulse signal when the voltage difference is larger than the specific voltage.

16. A word line driver array for a memory array, comprising:
   a first common transistor, having a gate for receiving a first pulse signal, a first terminal coupled to a ground and a second terminal; and
   a plurality of dual power rail word line drivers, each driving a word line of the memory array according to a predecode signal from a decoder powered by a first supply voltage, wherein each of the plurality of dual power rail word line drivers comprises:
      a signal buffering unit coupled between the word line and a node;
      a first transistor coupled between the second terminal of the first common transistor and the node, wherein the first transistor is controlled by the predecode signal; and
      a second transistor coupled between the node and a second supply voltage higher than or equal to the first supply voltage, having a gate for receiving a second pulse signal;
      wherein the signal buffering unit provides a word line signal corresponding to the predecode signal to the memory array via the word line when the second transistor is turned off and the first common transistor is turned on, and there is no level shifter on a critical timing path of the dual power rail word line driver.

17. The word line driver array as claimed in claim 16, wherein the second pulse signal is identical to the first pulse signal, and the first and second pulse signals are powered by the first supply voltage.

18. The word line driver array as claimed in claim 16, wherein the second transistor is a high threshold voltage transistor or a long channel transistor.

19. The word line driver array as claimed in claim 16, wherein each of the plurality of dual power rail word line drivers further comprises:
   a first inverter coupled between a gate of the first transistor and the decoder, controlling the first transistor to turn on or off according to the predecode signal, wherein the first inverter is powered by the first supply voltage.

20. The word line driver array as claimed in claim 16, wherein a difference between the first supply voltage and the second supply voltage is not larger than a threshold voltage of the second transistor.

21. The word line driver array as claimed in claim 16, wherein the signal buffering unit comprises:
   a third transistor coupled between the second supply voltage and the node, having a gate coupled to the word line; and
   a second inverter coupled between the node and the word line, wherein the second inverter is powered by the second supply voltage.

22. The word line driver array as claimed in claim 16, further comprising:
   a second common transistor, having a first terminal coupled to the second supply voltage and a second terminal, wherein the second common transistor is controlled according to a mode select signal.

23. The word line driver array as claimed in claim 22, wherein each of the plurality of dual power rail word line drivers further comprises:
   a fourth transistor coupled between the second terminal of the second common transistor and the node, having a gate for receiving the first pulse signal; and
   a level shifter, generating the second pulse signal according to the first pulse signal and the mode select signal;
   wherein the first pulse signal and the mode select signal are powered by the first supply voltage, and the second pulse signal is powered by the second supply voltage.

24. The word line driver array as claimed in claim 23, wherein the second common transistor is turned on by the mode select signal when a voltage difference between the first supply voltage and the second supply voltage is smaller than or equal to a specific voltage, and the second common transistor is turned off by the mode select signal when the voltage difference is larger than the specific voltage, wherein the specific voltage is not larger than a threshold voltage of the second transistor.

25. The word line driver array as claimed in claim 24, wherein the level shifter generates the second pulse signal to turn off the second transistor according to the mode select signal when the voltage difference is smaller than or equal to the specific voltage, and the level shifter generates the second pulse signal to turn on or off the second transistor according to the first pulse signal when the voltage difference is larger than the specific voltage.

* * * * *